United States Patent
Jin et al.

(10) Patent No.: US 10,289,225 B2
(45) Date of Patent: May 14, 2019

(54) ORGANIC LIGHT-EMITTING DISPLAY DEVICE WITH INTEGRATED PRESSURE SENSOR, AND ORGANIC LIGHT-EMITTING DISPLAY DEVICE WITH INTEGRATED TOUCH SCREEN

(71) Applicant: LG Display Co., Ltd., Seoul (KR)

(72) Inventors: JaeHyun Jin, Seoul (KR); IlChan Jung, Gangwon-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/494,754

(22) Filed: Apr. 24, 2017

(65) Prior Publication Data

US 2017/0308212 A1 Oct. 26, 2017

(30) Foreign Application Priority Data

Apr. 26, 2016 (KR) .................. 10-2016-0050753

(51) Int. Cl.
| | | |
|---|---|---|
| *G06F 3/041* | (2006.01) | |
| *G06F 3/044* | (2006.01) | |
| *H01L 27/32* | (2006.01) | |

(52) U.S. Cl.
CPC .......... *G06F 3/0412* (2013.01); *G06F 3/044* (2013.01); *G06F 3/0416* (2013.01); *H01L 27/323* (2013.01); *H01L 27/3262* (2013.01); *H01L 27/3276* (2013.01); *G06F 2203/04102* (2013.01); *G06F 2203/04105* (2013.01)

(58) Field of Classification Search
CPC ...... G06F 3/0412; G06F 3/0416; G06F 3/044; G06F 2203/04105; G06F 2203/04102; H01L 27/3276; H01L 27/323; H01L 27/3262

See application file for complete search history.

(56) References Cited

U.S. PATENT DOCUMENTS

| | | |
|---|---|---|
| 9,501,195 B1 | 11/2016 | Kim et al. |
| 2016/0026315 A1* | 1/2016 | Choi ............... G06F 3/0414 345/174 |
| 2016/0188039 A1 | 6/2016 | Yoon et al. |

FOREIGN PATENT DOCUMENTS

| | | |
|---|---|---|
| KR | 10-2011-0075134 A | 7/2011 |
| KR | 10-1452302 B1 | 10/2014 |
| KR | 10-1583765 B1 | 1/2016 |

\* cited by examiner

*Primary Examiner* — Aneeta Yodichkas
(74) *Attorney, Agent, or Firm* — Morgan, Lewis & Bockius LLP

(57) ABSTRACT

An organic light-emitting display (OLED) device with an integrated pressure sensor is provided. The OLED device includes a substrate, an organic light-emitting element, and a back-plate. The substrate has a thin-film transistor and has flexibility. The organic light-emitting element is connected to the thin-film transistor on the substrate. The back-plate supports the substrate under the substrate and has a pressure sensor configured to measure the intensity of a touch input. The OLED device with an integrated pressure sensor includes a pressure sensor configured to support a substrate and measure the intensity of a touch input, so that a separate pressure sensor attached to the display device in an add-on type touch screen panel can be eliminated.

13 Claims, 12 Drawing Sheets

ORGANIC LIGHT-EMITTING DISPLAY DEVICE WITH INTEGRATED PRESSURE SENSOR, AND ORGANIC LIGHT-EMITTING DISPLAY DEVICE WITH INTEGRATED TOUCH SCREEN

CROSS-REFERENCE TO RELATED APPLICATIONS

This application claims the priority of Korean Patent Application No. 10-2016-0050753 filed on Apr. 26, 2016, in the Korean Intellectual Property Office, the disclosure of which is incorporated herein by reference.

BACKGROUND

Technical Field

The present disclosure relates to an organic light-emitting display (OLED) device with an integrated pressure sensor and an OLED device with an integrated touch screen, and more specifically to an OLED device with an integrated pressure sensor and an OLED device with an integrated touch screen.

Description of the Related Art

A touch screen penal is a device that senses a user's touch input such as touch or gesture made on the screen of a display device. Such a touch screen panel is widely employed in portable display devices such as smart phones and tablet PCs, as well as in large display devices such as display devices placed in public facilities and smart TVs. Such touch screen panels may be sorted into resistive touch screen panels, capacitive touch screen panels, optical touch screen panels, and electro-magnetic (EM) touch screen panels by operation manner.

Among various touch screen panels, a capacitive touch screen panel is commonly used because it has a fast response speed and a thin thickness. The capacitive touch screen panel senses a change in the capacitance between the touch electrode and the finger or senses a change in mutual capacitance between the first touch electrode and the second touch electrode intersecting with each other due to the touch input, to calculate the position of the touch input.

However, such a capacitive touch screen panel has limitation in that it can only detect the two-dimensional position of a touch input. That is, the capacitive touch screen panel can sense a change in the capacitance at the point where a touch input is made to thereby calculate the position of the touch input, but cannot measure the intensity of the touch input.

As electronic devices having a touch input function such as a smart phone and a tablet PC are widely used, there is increasing demand for a touch screen panel capable of sensing more various components of a touch input. Accordingly, a touch screen panel capable of measuring not only the position of a touch input but also the intensity of the touch input is under development.

Lately, a flexible display device is attracting attention as the next generation display device. Such a flexible display devices are fabricated by forming pixels and lines on a flexible substrate made of flexible material such as plastic so that it is able to display images even if it is bent, like paper. In particular, a flexible OLED device using an organic light-emitting diode is a self-luminous, and thus does not require a separate light source, unlike a liquid-crystal display (LCD) device. Therefore, it can be made lighter and thinner.

Applications of such flexible OLED devices are increasing from computer monitors and televisions to personal portable devices. Accordingly, research into flexible OLED devices having a larger display area with reduced volume and weight is ongoing.

The substrate of a flexible OLED device is composed of a thin film to have excellent flexibility. However, the substrate in the form of a thin film has a problem that it may be easily warped and torn. In order to prevent this, a back-plate is disposed under the substrate of the flexible OLED device to prevent the substrate from being warped or torn. The back-plate has a thickness greater than that of the substrate to support the substrate and to reinforce the rigidity of the substrate. Incidentally, when the above-mentioned touch screen panel is attached to the upper surface of the flexible OLED device, the thickness of the flexible OLED device becomes further thicker.

SUMMARY

The inventors of the application have studied on a touch screen panel capable of sensing both the two-dimensional position of the point where a touch input is made and the intensity of the touch input. The inventors of the present invention have recognized that an add-on type touch screen panel in which a separate pressure sensor is attached to a display device increases the thickness of the display device and thus is not suitable for reducing the thickness of the display device, making it difficult to implement a flexible OLED device. In view of the above, the inventors of the application have devised an OLED device with an integrated pressure sensor that is capable of sensing the intensity of a touch input without a separate pressure sensor by incorporating a pressure sensor therein.

Accordingly, embodiments of the present disclosure are directed to an OLED device with an integrated pressure sensor and an OLED device with an integrated touch screen that substantially obviate one or more of the problems due to limitations and disadvantages of the related art.

An object of the present disclosure is to provide an OLED device with an integrated pressure sensor and an OLED device with an integrated touch screen capable of measuring the intensity of a touch input without an additional pressure sensor by incorporating a pressure sensor in a back-plate for supporting a substrate.

Another object of the present disclosure is to provide an OLED device with an integrated pressure sensor and an OLED device with an integrated touch screen capable of sensing the position and intensity of a touch input by utilizing a touch electrode of a touch position sensing unit for sensing the position of the touch input in response to the touch input as one electrode of a pressure sensor for measuring the intensity of the touch input.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an OLED device comprises a substrate, an organic light-emitting element, and a back-plate. The substrate has a thin-film transistor and has flexibility. The organic light-emitting element is connected to the thin-film transistor on the substrate. The back-plate supports the substrate below the substrate and has a pressure sensor configured to measure the intensity of a touch input. The OLED device with an integrated pressure sensor according to an exemplary embodiment of the present disclosure includes a pressure sensor configured to support a substrate and measure the intensity of a touch input, so that a separate pressure sensor attached to the display device in an add-on type touch screen panel can be eliminated, thereby providing an OLED device with an integrated pressure sensor that is thin and has good flexibility.

In another aspect, an OLED device with an integrated touch screen comprises a substrate, an organic light-emitting element, a first touch electrode, a second touch electrode, an elastic member, and a third touch electrode. The substrate has a thin-film transistor and has flexibility. The organic light-emitting element is connected to the thin-film transistor on the substrate. The first touch electrode and the second touch electrode are on the substrate. The elastic member supports the substrate. The third touch electrode is under the elastic member and overlaps with the first touch electrode or the second touch electrode. The OLED device with an integrated touch screen according to an exemplary embodiment of the present disclosure includes a first touch electrode, a second touch electrode, an elastic member, and a third touch electrode. Since one of the first touch electrode and the second touch electrode for sensing the position of a touch input can be used as the upper electrode of the pressure sensor for measuring the intensity of the touch input, there is an advantage in that the upper electrode of the pressure sensor can be eliminated. Further, since the elastic member also works as a back-plate for supporting the substrate, there is an advantage in that the flexible OLED device can be implemented even without a separate back-plate.

Particulars of the exemplary embodiments of the present disclosure will be described in the detail description with reference to the accompanying drawings.

According to an exemplary embodiment of the present disclosure, a back-plate for preventing warpage of a substrate and supporting the substrate also works as a pressure sensor for measuring the intensity of a touch input, and thus a separate pressure sensor attached to the display device in an add-on type touch screen panel can be omitted. Accordingly, a thin display device or a flexible OLED device can be implemented easily.

In addition, according to an exemplary embodiment of the present disclosure, an elastic member of the back-plate works as a dielectric layer of the pressure sensor, the distance between the upper electrode and the lower electrode can be maintained even if the substrate is bent. Accordingly, the intensity of a touch input can be measured accurately even if the substrate is bent.

In addition, according to an exemplary embodiment of the present disclosure, the touch electrode for sensing the position of a touch input can be utilized as one electrode of the pressure sensor for sensing the intensity of the touch input, such that one electrode of the pressure sensor can be omitted. Accordingly, various components of a touch input can be recognized by using a less number of touch electrodes.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
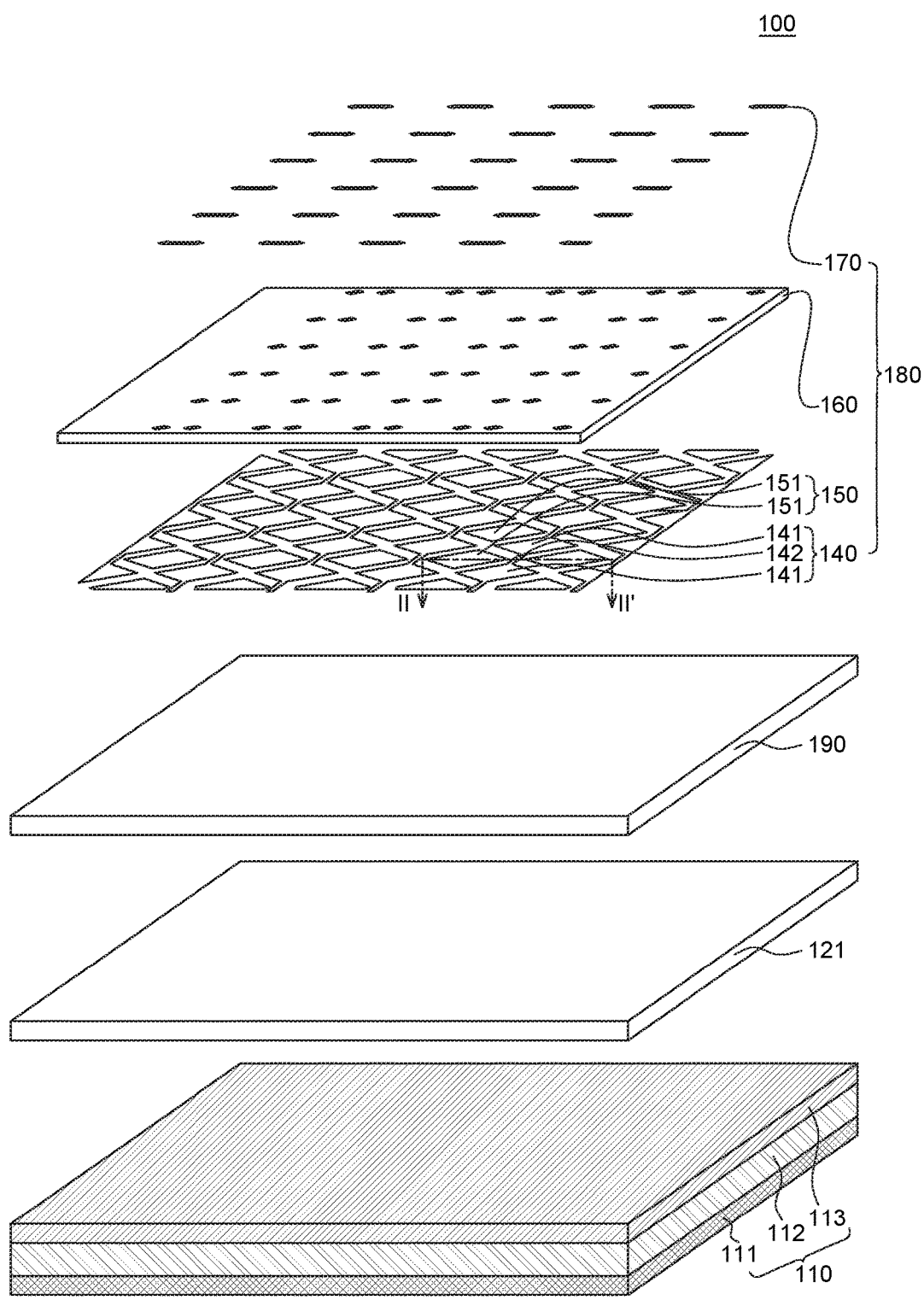
FIG. 1 is an exploded perspective view of an OLED device with an integrated pressure sensor according to an exemplary embodiment of the present disclosure.

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second and the like in the descriptions and in the claims are used for distinguishing between similar elements and not necessarily for describing a sequential or chronological order. Theses terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

Figure 2:
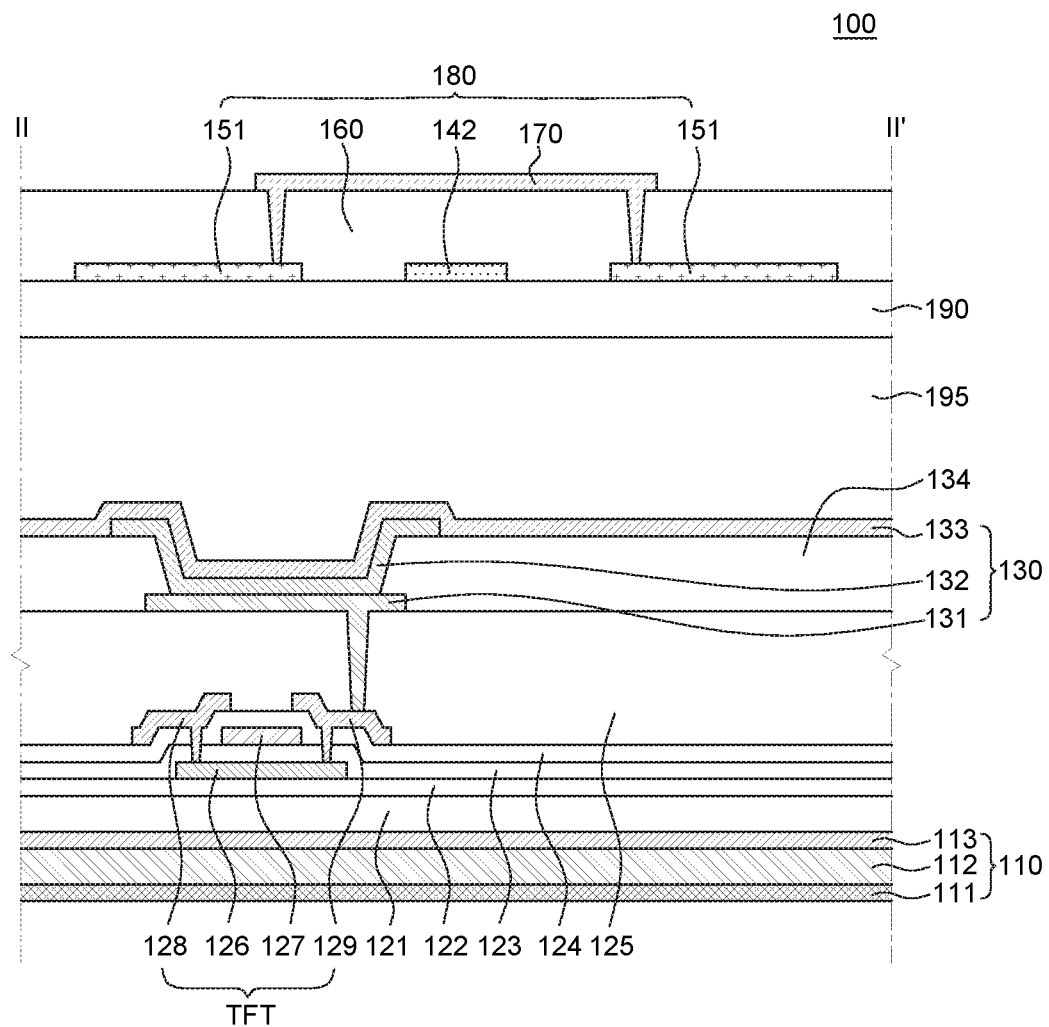
FIG. 2 is a schematic cross-sectional view taken along line II-II' of FIG. 1.

FIG. 1 is an exploded perspective view of an OLED device with an integrated pressure sensor according to an exemplary embodiment of the present disclosure. FIG. 2 is a schematic cross-sectional view taken along line II-II' of FIG. 1. For convenience of illustration, a thin-film transistor TFT and an organic light-emitting element 130 disposed on a substrate 121 are omitted in FIG. 1. Referring to FIG. 1, the OLED device with an integrated pressure sensor 100 includes a substrate 121, a cover substrate 190, a touch position sensing unit 180, and a back-plate 110.

The substrate 121 serves to support and protect various elements of the OLED device 100. The substrate 121 may be made of an insulative material, for example, a plastic material having flexibility. The substrate 121 may be implemented as a thin-film plastic film made of a polymer such as polyimide, polyethylene naphthalate (PEN), or polyethylene terephthalate (PET). The substrate 121 may have a thickness of, for example, 5 μm to 50 μm to have excellent flexibility.

With the substrate having flexibility, the OLED device 100 may be implemented as a flexible OLED device. The OLED device 100 including the substrate 121 implemented as a thin-film plastic film can be applied to a variety of display devices including a TV, a mobile device, a tablet PC, a monitor, a laptop computer, an automobile display device, etc. Alternatively, such an OLED device may be applied to a wearable display device, a foldable display device, and a rollable display device as well.

A thin-film transistor (TFT) and an organic light-emitting element 130 are disposed on the substrate 121. The thin-film transistor TFT turns on or off the organic light-emitting element 130. The organic light-emitting element 130 constitutes a pixel of the OLED device 100. A detailed description thereof will be made below with reference to FIG. 2.

The cover substrate 190 faces the substrate 121 and protects the organic light-emitting element 130 and the thin-film transistor TFT disposed on the substrate 121 from the external environment. In addition, the cover substrate 190 supports the touch position sensing unit 180. The cover substrate 190 may be a colorless transparent glass substrate or a transparent plastic substrate so as not to degrade the visibility of the OLED device 100. For example, the cover substrate 190 may be made of a transparent plastic material having flexibility.

According to some embodiments, a polarizing film may be further disposed on the cover substrate 190 to prevent reflection of external light. By doing so, the visibility of the OLED device 100 can be further improved.

The touch position sensing unit 180 is disposed on the cover substrate 190 and senses the position of the touch input. The touch position sensing unit 180 includes a first touch electrode 140 and a second touch electrode 150.

The first touch electrode 140 includes a plurality of first touch blocks 141, and the second touch electrode 150 includes a plurality of second touch blocks 151. The first touch blocks 141 and the second touch blocks 151 are arranged in different directions. For example, the first touch blocks 141 are arranged along a first direction while the second touch blocks 151 are arranged along a second direction different from the first direction. Accordingly, the first touch electrode 140 and the second touch electrode 150 intersect each other. A capacitance for sensing a touch input is formed in each of the intersections where the first touch electrode 140 and the second touch electrode 150 cross each other. The first touch electrode 140 and the second touch electrode 150 intersect each other to define a plurality of touch cells. The size of a touch cell may be equal to the average finger size of users.

The first touch blocks 141 and the second touch blocks 151 may have a certain shape. For example, as shown in FIG. 1, the first touch blocks 141 and the second touch blocks 151 may have a diamond shape. However, the shape of the first touch blocks 141 and the second touch blocks 151 is not limited to the diamond shape but may be various shapes such as a polygon, a circle, an ellipse, etc.

The first touch blocks 141 and the second touch blocks 151 are made of a conductive material. For example, in order to prevent the visibility of the OLED device 100 from being degraded by the first touch blocks 141 and the second touch blocks 151, the first touch blocks 141 and the second touch blocks 151 may be made of a transparent conductive oxide (TCO) such as indium tin oxide (ITO) or indium zinc oxide (IZO). The first touch blocks 141 and the second touch blocks 151 may be made of silver (Ag) nano wire, carbon nanotube (CNT), or graphene (CNT), etc., which have excellent transmittance and electric conductivity. According to some embodiments, the first touch blocks 141 and the second touch blocks 151 may be made up of metal lines in the form of a mesh. By making the width of the metal lines thin, the first touch blocks 141 and the second touch blocks 151 can have transparency generally. According to some embodiments, the first touch blocks 141 and the second touch blocks 151 may be made up of a plurality of segment electrodes made of metal lines in the form of a mesh and a transparent conductive oxide. The segment electrodes are in contact with the metal lines in the form a mesh, and the effective electrode area of the metal line is ensured, thereby improving the effective capacitance between the first touch blocks 141 and the second touch blocks 151.

The first touch blocks 141 and the second touch blocks 151 are disposed on the same plane on the cover substrate 190. The first touch blocks 141 and the second touch blocks 151 may be adhered to the cover substrate 190, for example, by a transparent adhesive material such as super view resin (SVR) or optically clear adhesive (OCA). Alternatively, the first touch blocks 141 and the second touch blocks 151 may be directly formed on the cover substrate 190, for example, by sputtering, printing, slit coating, etc.

The plurality of first touch blocks 141 are electrically connected to one another. For example, as shown in FIG. 1, the first touch blocks 141 are electrically connected to one another through a first connection part 142. In addition, the plurality of second touch blocks 151 are electrically connected to one another through a second connection part 170 disposed on a plane different from the first connection part 142. This will be described in more detail with reference to FIG. 2.

Referring to FIG. 2, an insulating layer 160 is disposed on the cover substrate 190 to cover the first touch blocks 141 and the second touch blocks 151. The insulating layer 160 works as a planarization layer for providing a flat surface over the first touch blocks 141 and the second touch blocks 151. The insulating layer 160 may be made of a transparent insulative material so as not to degrade the visibility of the OLED device 100. For example, the insulating layer 160 may be made of photo acryl (PAC). In the insulating layer 160, contact holes are formed. The contact holes expose a part of the second touch blocks 151, such that the second connection part 170 comes in contact with the second touch blocks 151 through the contact holes, respectively.

The second connection part 170 electrically connects the second touch blocks 151 with one another. For example, as shown in FIG. 2, the second connection part 170 comes in contact with the second touch blocks 151 exposed through the contact holes in the insulating layer 160. The second touch blocks 151 may be connected to each other by the second connection part 170 to work as one touch electrode. The second connection part 170 may be made of a conductive material. For example, the second connection part 170 may be made of a metal having a low resistance such as aluminum (Al), copper (Cu), magnesium (Mg) and silver (Ag), or a transparent conductive oxide such as ITO and IZO.

When a touch input is made, the touch position sensing unit 180 senses the two-dimensional position of the touch input. Specifically, a touch driving signal may be applied to the first touch electrode 140, and the second touch electrode 150 may be connected to the ground potential. Then, mutual capacitance may be formed between the first touch blocks 141 of the first touch electrode 140 and the second touch blocks 151 of the second touch electrode 150. If a user's touch input is made above the cover substrate 190, the mutual capacitance between the first touch blocks 141 and the second touch blocks 151 may be changed due to the user's finger. That is, since the user's finger works as a grounded conductor, the electric field between the first touch block 141 and the second touch block 151 is changed by the finger. As a result, the mutual capacitance between the first touch block 141 and the second touch block 151 is changed. As described above, the first touch blocks 141 and the second touch blocks 151 are arranged to intersect each other, and intersections of the first touch blocks 141 and the second touch blocks 151 are defined as touch cells. Accordingly, the position of the touch input can be sensed by detecting the two-dimensional coordinates of the touch cell whose mutual capacitance is changed.

Hereinafter, the thin-film transistor TFT and the organic light-emitting element 130 disposed on the substrate 121 will be described. The thin-film transistor TFT is disposed on a buffer layer 122 on the substrate 121. The buffer layer 122 prevents permeation of moisture or impurity through the substrate 121 and provides a flat surface over the substrate 121. It is to be noted that the buffer layer 122 is not an essential element. The buffer layer 121 may or may not be formed based on the type of the substrate 121 or the type of the thin-film transistor TFT.

The thin-film transistor TFT is formed on the buffer layer 122 and supplies a signal to the organic light-emitting element 130. The thin-film transistor TFT includes an active layer 126, a gate electrode 127, and a source electrode 128 and a drain electrode 129. Specifically, the active layer 126 is formed on the buffer layer 122, and a gate insulating layer 123 is formed on the active layer 126 for insulating the active layer 126 from the gate electrode 127. The gate electrode 127 is formed on the gate insulating layer 123 such that it overlaps with the active layer 126. An interlayer insulating layer 124 is formed on the gate electrode 127 and the gate insulating layer 123. The source electrode 128 and the drain electrode 129 are formed on the interlayer insulating layer 124. The source electrode 128 and the drain electrode 129 are electrically connected to the active layer 126.

The active layer 126 may be made of an amorphous silicon (a-Si), a polycrystalline silicon (poly-Si), an oxide semiconductor, an organic semiconductor, or the like. When the active layer 126 is made of an oxide semiconductor, it may be made of, but is not limited to, ITO, IZO, IGZO (Indium Gallium Zinc Oxide), ITZO (Indium Tin Zinc Oxide), or the like. When the active layer 126 is made of IGZO, the composition ratio of In:Ga:Zn may be 1:2:1. In the active layer 126, a Ga-rich layer for reducing the PBTS may be formed on the upper surface of the IGZO layer.

FIG. 2 shows only the driving thin-film transistors TFT connected to the anode 131 of the organic light-emitting element 130 among various thin-film transistors TFTs included in the OLED device 100, for convenience of illustration. It is to be understood that the OLED device 100 may further include a switching thin-film transistor, a capacitor, etc. for driving the organic light-emitting element 130. In addition, although the thin-film transistor TFT has a coplanar structure herein, an inverted staggered thin-film transistor may also be used. In addition, although the anode 131 of the organic light-emitting element 130 is connected to the drain electrode 129 of the thin-film transistor TFT in FIG. 2, the anode 131 of the organic light-emitting element 130 may be connected to the source electrode 128 of the thin-film transistor TFT depending on design choice.

A planarization layer 125 is disposed on the thin-film transistor TFT. The planarization layer 125 provides a flat surface over the substrate 121 and may be made of an organic insulative material so as to cover the level differences on the substrate 121. The planarization layer 121 includes a contact hole for electrically connecting the thin-film transistor TFT to the anode 131 of the organic light-emitting element 130.

The organic light-emitting element 130 is disposed on the planarization layer 125 and includes an anode 131, an organic layer 132, and a cathode 133. Although only one organic light-emitting element 130 is shown in FIG. 2, a plurality of organic light-emitting elements 130 may be disposed in each of the to a plurality of pixels the OLED device 100.

The anode 131 is an electrode for supplying holes into the organic layer 132 and may be made of a transparent conductive material having a high work function. The transparent conductive material may include, but is not limited to, ITO, IZO, ITZO, etc. When the OLED device 100 is a top-emission OLED device as shown in FIG. 2, the anode 131 may further include a reflective plate. The anode 131 may also be referred to as a pixel electrode.

The cathode 133 is an electrode for supplying electrons to the organic layer 132 and may be made of a metal having a relatively low work function such as silver, titanium (Ti), aluminum, molybdenum (Mo) or an alloy of silver and magnesium (Ag:Mg). The cathode 133 may also be referred to as a common electrode. When the cathode 133 is made of an alloy of silver and magnesium, the resistance of the cathode 133 can be lowered by increasing the content of silver relative to the content of magnesium. In doing so, an ytterbium (YB) layer may be disposed on/under the alloy of silver and magnesium (Ag:Mg) layer, in order to prevent silver from being oxidized to lower the resistance.

The organic layer 132 is disposed between the anode 131 and the cathode 133. The organic layer 132 includes an organic emission layer. The organic emission layer may be a patterned emission layer as shown in FIG. 2. In the pattern emission layer structure, an emission layer is formed in each of the pixels, and different emission layers emit light of different colors. For example, a red organic emission layer for emitting red light, a green organic emission layer for emitting green light, and a blue organic emission layer for emitting blue light are disposed on a red sub-pixel, a green sub-pixel, and a blue sub-pixel, respectively. The red sub-pixel, the green sub-pixel and the blue sub-pixel may constitute one pixel. In each of the red organic emission layer, the green organic emission layer and the blue emission layer, holes supplied from the anode 131 and electrons supplied from the cathode 133 are combined to emit light. Each of the organic emission layers may be deposited by patterning using an opened mask, for example, a fine metal mask (FMM) in the respective sub-pixels. However, the organic emission layer may also be shared by all of the sub-pixels on the substrate 121, for example. In this case, the organic emission layer may be made of a material that emits white light, and a color filter may be disposed in each of the organic emission layers.

In addition to the organic emission layer, the organic layer 132 may further include organic layers such as an injecting layer and a transporting layer for improving the luminous efficiency of the organic light-emitting element. At least some of such organic layers may have a common structure shared by the plurality of sub-pixels to take advantage of a simple manufacturing process.

The organic layers having a common structure may be formed using a common mask in which all the sub-pixels are opened, and may be stacked in the same structure in all of the sub-pixels without a pattern to define each sub-pixel. That is, the organic layer having the common structure is continuously connected or extended from one sub-pixel to the neighboring sub-pixel without being disconnected, and is shared by the plurality of sub-pixels.

For example, a hole injection layer or a hole transport layer may be further disposed between the anode 131 and the cathode 133, in addition to the organic emission layer, to facilitate the movement of the holes. The hole injection layer or the hole transport layer may have a common structure that is disposed commonly to the plurality of sub-pixels. In some embodiments, the hole transport layer may comprise a p-type hole transport layer doped with a p-type dopant.

The bank layer 134 may define a sub-pixel and expose a part of the upper surface of the anode 131. Specifically, the bank layer 134 may be disposed such that it cover the edge of the anode 131. The bank layer 134 is made of an insulative material for insulating the anodes 131 of adjacent sub-pixels from each other. According to some embodiments, the bank layer 134 may be implemented as a black bank having a high light absorptivity to avoid color mixing between adjacent sub-pixels.

A filler 195 is disposed between the cover substrate 190 and the organic light-emitting element 130 such that the space therebetween is filled with the filler 195. The filler 195 may be formed of a transparent moisture-proofing agent to suppress the permeation of moisture into the organic light-emitting element 130.

A back-plate 110 is disposed under the substrate 121. The back-plate 110 supports the substrate 121 so that the substrate 121 is not easily warped or torn. As mentioned earlier, the substrate 121 may be in the form of a thin film made of a plastic material having flexibility. Accordingly, the thickness of the substrate 121 is very thin, so that it may be easily warped or torn. The back-plate 110 supplements the rigidity of the substrate 121 by supporting the substrate 121 in the form of a thin film.

The back-plate 110 includes an upper electrode 113, an elastic member 112, and a lower electrode 111. The upper electrode 113 is in contact with the lower surface of the substrate 121. The upper electrode 113 may be made of a transparent conductive oxide such as ITO, IZO or ITZO, or may be made of a metal including aluminum, titanium, magnesium, etc. That is, since the upper electrode 113 is disposed under the organic light-emitting element 130, the lower electrode 113 rarely degrades the visibility and thus the upper electrode 113 does not need to be made of a transparent material. However, if the upper electrode 113 is made of a transparent conductive oxide, the upper electrode 113 can efficiently suppress the permeation of moisture, and therefore, it may work as a moisture-proof layer on the back surface of the substrate 121.

The elastic member 112 is disposed under the upper electrode 113. The elastic member 112 is disposed between the upper electrode 113 and the lower electrode 111 to isolate them from each other. When a touch input is made on the OLED device 100, the elastic member 112 is compressed in response to the touch input. When the touch input is released, the elastic member 112 is restored to its original thickness. The elastic member 112 has an appropriate elastic modulus so that it is easily compressed and restored.

The elastic member 112 may be made of an elastomer which can be easily compressed and restored in response to an touch input. For example, the elastic member 112 may be made of a thermoplastic elastomer (TPE) such as a polyolefin, a polyvinyl chloride (PVC), a polystyrene, a polyester, a polyurethane, a polyamide, etc. However, the constituent material of the elastic member 112 is not limited thereto, and the elastic member 112 may be composed of various materials having elasticity. The elastic member 112 may be configured as a single-layer structure including the elastic member or a multi-layer structure including another film other than the elastic member. For example, the another film may be a thin glass, a metal foil covered with a dielectric material, a multi-layer polymeric stack, and a polymeric synthetic film including a polymeric material combined with internally dispersed nanoparticles or microparticles. Particularly, since the thin glass suppresses the permeation of moisture, it can work as a moisture-proof layer for suppressing the permeation of moisture into the substrate 121 from its lower surface.

In some embodiments, the portion of the elastic member 112 in the active area where a touch input is made may be made of a thermoplastic elastomer. On the other hand, the portion of the elastic member 112 in the area where no touch input is made and the OLED device 100 is bent may be implemented as a plastic thin film made of polyimide, polyethylene naphthalate (PEN), polyethylene terephthalate (PET), other suitable polymers, a combination of these polymers, etc.

In addition, the elastic member 112 may further comprise at least one light-shielding material capable of reducing the amount of external light incident from below the substrate 121. For example, the elastic member 112 may further comprise a chloride-based carbon black. In this case, the back-plate 110 including the elastic member 112 can work as a film that suppresses the problems that may arise during the process of manufacturing the OLED device 100. Specifically, during the process of manufacturing the OLED device 100, a part of the substrate 121 may be exposed to external light. The conditions of the elements on the substrate 121 or some materials themselves used in manufacturing the elements may be undesirably changed (e.g., voltage shift in TFTs may occur) due to exposure during the process of manufacturing the OLED device 100. In particular, some portions of the substrate 121 may be exposed more to external light than the other portions, which may cause display non-uniformity (e.g., spots, shadow defects, etc.). However, when the elastic member 112 further includes a light-shielding material, the external light is efficiently absorbed by the light-shielding material, such that the above-mentioned problems arising during the exposure process can be reduced.

In addition, when the elastic member 112 further includes the light-shielding material, the back-plate 110 including the elastic member 112 prevents reflection of external light, thereby improving the visibility of the OLED device 100.

Although the elastic member 112 of the back-plate 110 blocks unwanted external light to thereby improve display uniformity and reduce reflection of external light as described above, it may make it difficult to recognize an alignment mark for accurately positioning the elements on the substrate 121 or for performing the manufacturing process. For example, the elements on the substrate 121 may be positioned or aligned by comparing outer boundary lines of the overlapping portions of the layer(s) during the bending of the OLED device 100. Accordingly, it may be difficult to position or align the layers if the elastic member blocks external light. In addition, there may be a problem in inspecting unwanted debris or other foreign matter in the OLED device 100 if the elastic member 112 blocks light in an overly wide range of optical spectrum (i.e., wavelengths of visible, ultraviolet and infrared spectra).

For these reasons, in some embodiments, the light-shielding material, which may be included in the elastic member 112, may be configured to transmit a certain polarized light and/or light in a predetermined wavelength range that may be used in one or more manufacturing processes and/or test processes of the OLED device 100. For example, the elastic member 112 may transmit light (e.g., UV, IR spectrum light) to be used for quality inspection and/or alignment processes during manufacture of the OLED device 100 while it may filter light in the visible wavelength range. By transmitting the light within a predetermined wavelength range by the elastic member 112, the quality inspection and/or alignment processes can be readily performed during manufacturing of the OLED device 100.

The elastic member 112 has an appropriate thickness so that it reinforces the rigidity of the substrate 121 and facilitates compression and restoration in response to a touch input. For example, the elastic member 112 may have a thickness of 50 μm to 200 μm. When the elastic member 122 has a thickness in the above range, the OLED device 100 may be implemented as a flexible OLED device with appropriate rigidity.

The lower electrode 111 is disposed under the elastic member 112 and overlaps with the upper electrode 113. The lower electrode 111 is made of a conductive material. For example, the lower electrode 111 may be made of a transparent conductive oxide or a metal. When the lower electrode 111 is formed of a transparent conductive oxide, the lower electrode 111 may work as a moisture-proof layer of the OLED device 100, like the upper electrode 113. When the lower electrode 111 is made of a metal, the lower electrode 111 may also work as a layer for discharging external static electricity.

Since the back-plate 110 includes the upper electrode 113 and the lower electrode 111 overlapping with each other on and under the elastic member 112, respectively, the back-plate 110 not only supports the substrate 121 but also works as a pressure sensor for measuring the intensity of a touch input when a user makes the touch input.

Specifically, the lower electrode 111 and the upper electrode 113 of the back-plate 110 forms a capacitor with the elastic member 112 interposed therebetween, and the intensity of a touch input can be measured based on the amount of a change in the capacitance between the upper electrode 113 and the lower electrode 111. To form the capacitance between the upper electrode 113 and the lower electrode 111, a predetermined voltage may be applied to the upper electrode 113 while the lower electrode 111 may be connected to the ground potential or a different voltage may be applied to the lower electrode 111.

If a user's touch input is made on the cover substrate 190, the position of the touch input is sensed by the touch position sensing unit 180. Then, the cover substrate 190 is pressed in proportion to the intensity of the touch input, and the substrate 121 disposed under the cover substrate 190 is pressed. Accordingly, the elastic member 112 under the substrate 121 is compressed and the distance between the upper electrode 113 and the lower electrode 111 is reduced.

The capacitance of the capacitor formed by the upper electrode 113 and the lower electrode 111 may be expressed by the following equation:

$$C = \varepsilon \frac{A}{d} \quad \text{[Equation 1]}$$

where C denotes the capacitance of the capacitor, c denotes the dielectric constant of the elastic member 112, A denotes the area of the upper electrode 113 and the lower electrode 111, and d denotes the distance between the upper electrode 113 and the lower electrode 111.

When a strong touch input is made, the cover substrate 190 is strongly pressed, which causes the substrate 121 to be pressed strongly, so that the elastic member 112 is relatively more compressed. Since the distance between the upper electrode 113 and the lower electrode 111 is reduced as the elastic member 112 is compressed, the capacitance between the upper electrode 113 and the lower electrode 111 is changed. On the other hand, when a weak touch input is made, the cover substrate 190 is relatively weakly pressed. This causes the substrate 121 to be slightly pressed, so that the elastic member 112 is relatively weakly compressed, and the distance between the upper electrode 113 and the lower electrode 111 is relatively less reduced. Therefore, the capacitance between the upper electrode 113 and the lower electrode 111 is slightly changed. As a result, by measuring the capacitance between the upper electrode 113 and the lower electrode 111, the intensity of the touch input can be measured.

In the OLED device 100 according to the exemplary embodiment of the present disclosure, the back-plate 110 supporting the substrate 121 works as a pressure sensor, and thus no additional pressure sensor for measuring the intensity of a touch input is required. Specifically, the touch position sensing unit 180 can sense only the two-dimensional position of a touch input, but cannot measure the intensity of the touch input. In order to measure the intensity of a touch input, an additional pressure sensor has to be attached above or below the display device as an add-on type touch screen panel. In contrast, the OLED device 100 with an integrated pressure sensor according to the exemplary embodiment of the present disclosure includes the back plate 110 working as a pressure sensor. Since a flexible OLED device has a very thin substrate 121, the back plate 110 supporting the substrate 121 is an essential element. In the OLED device 100 with an integrated pressure sensor according to the exemplary embodiment of the present disclosure, the back-plate 110 including a pressure sensor supports the substrate 121, such that it prevents the substrate from being warped and also measures the intensity of a touch input. Accordingly, the OLED device 100 can have a smaller thickness than a display device having an additional pressure sensor, and can be implemented as a flexible OLED device more easily.

In addition, since the OLED device 100 according to the embodiment of the present disclosure does not include an air gap, there is an advantage that the intensity of a touch input can be more accurately measured in the flexible OLED device. Specifically, a typical pressure sensor includes an air gap disposed between an upper electrode and a lower electrode. When a touch input is applied to a typical pressure sensor, the upper electrode is bent by the applied pressure, but the pressure applied to the upper electrode is not transferred to the lower electrode by the air gap, and accordingly the lower electrode remains flat. As a result, the distance between the upper electrode and the lower electrode is reduced, and thus the capacitance between the upper electrode and the lower electrode is changed.

When a typical pressure sensor including an air gap is applied to a flexible OLED device, there may be a problem that the bending of the flexible OLED device is erroneously recognized as a touch input. For example, when the flexible OLED device is bent, the substrate is bent together with the upper electrode of the pressure sensor, but the lower electrode may not be bent by the air gap. When this happens, the distance between the upper electrode and the lower electrode is locally reduced, such that the capacitance between the upper electrode and the lower electrode changes. Therefore, the bending of the flexible OLED device may be erroneously recognized as a touch input.

In contrast, the OLED device 100 according to the exemplary embodiment of the present disclosure does not include an air gap and includes an elastic member 112 instead of an air gap. When the OLED device 100 is bent, the substrate 121 is bent together with the upper electrode 113, and the elastic member 112 in contact with the upper electrode 113 is also bent. Since the lower electrode 111 comes in contact with the elastic member 112, the lower electrode 111 may be curved conforming to the curved lower surface of the elastic member 112 as it is bent. Thus, the distance between the upper electrode 113 and the lower electrode 111 can be maintained substantially uniform in the bent portion. Accordingly, in the OLED device 100, the intensity of a touch input can accurately measured even if the device is bent.

Figure 3:
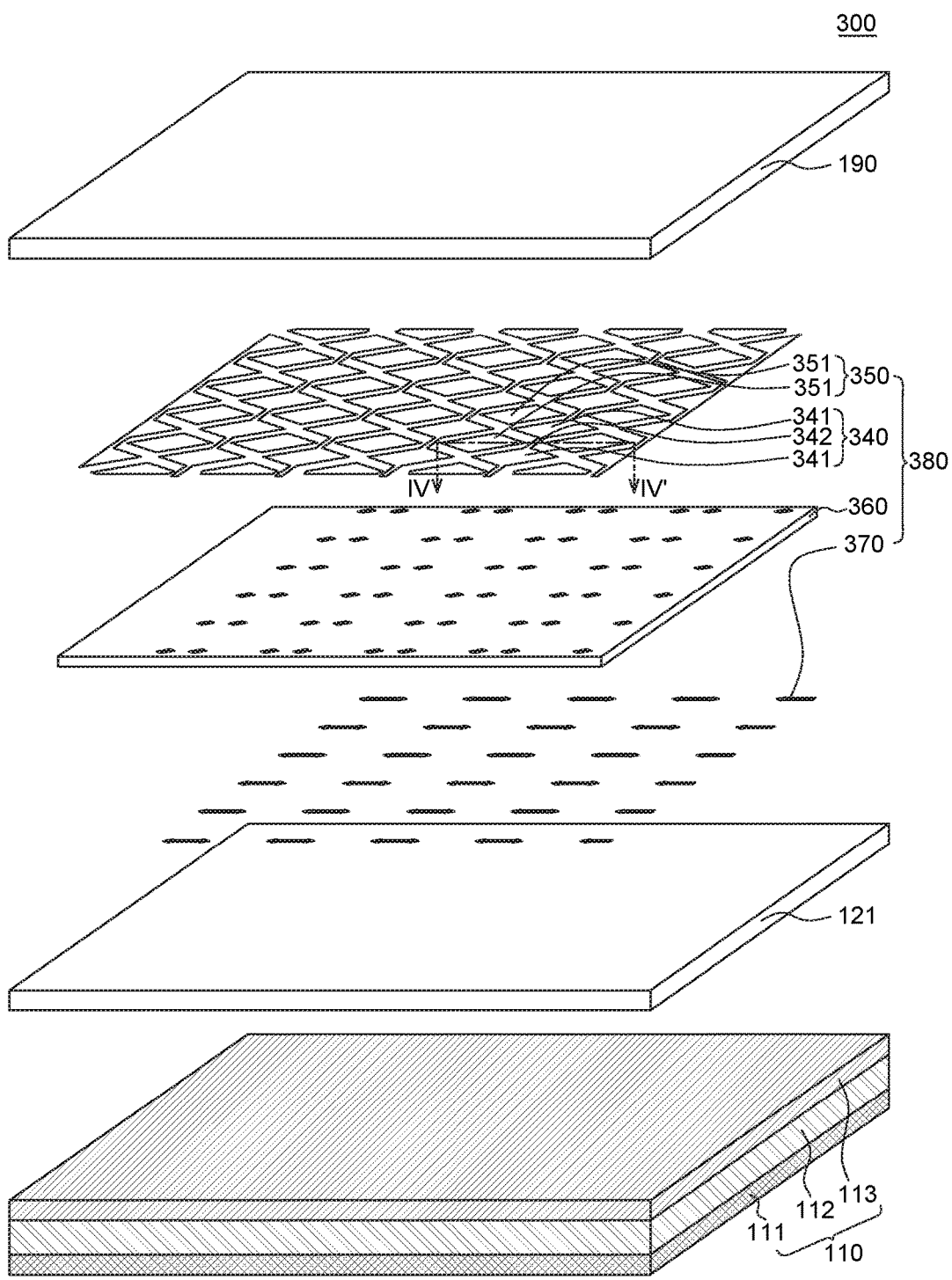
FIG. 3 is an exploded perspective view of an OLED device with an integrated pressure sensor according to another exemplary embodiment of the present disclosure.
Figure 4:
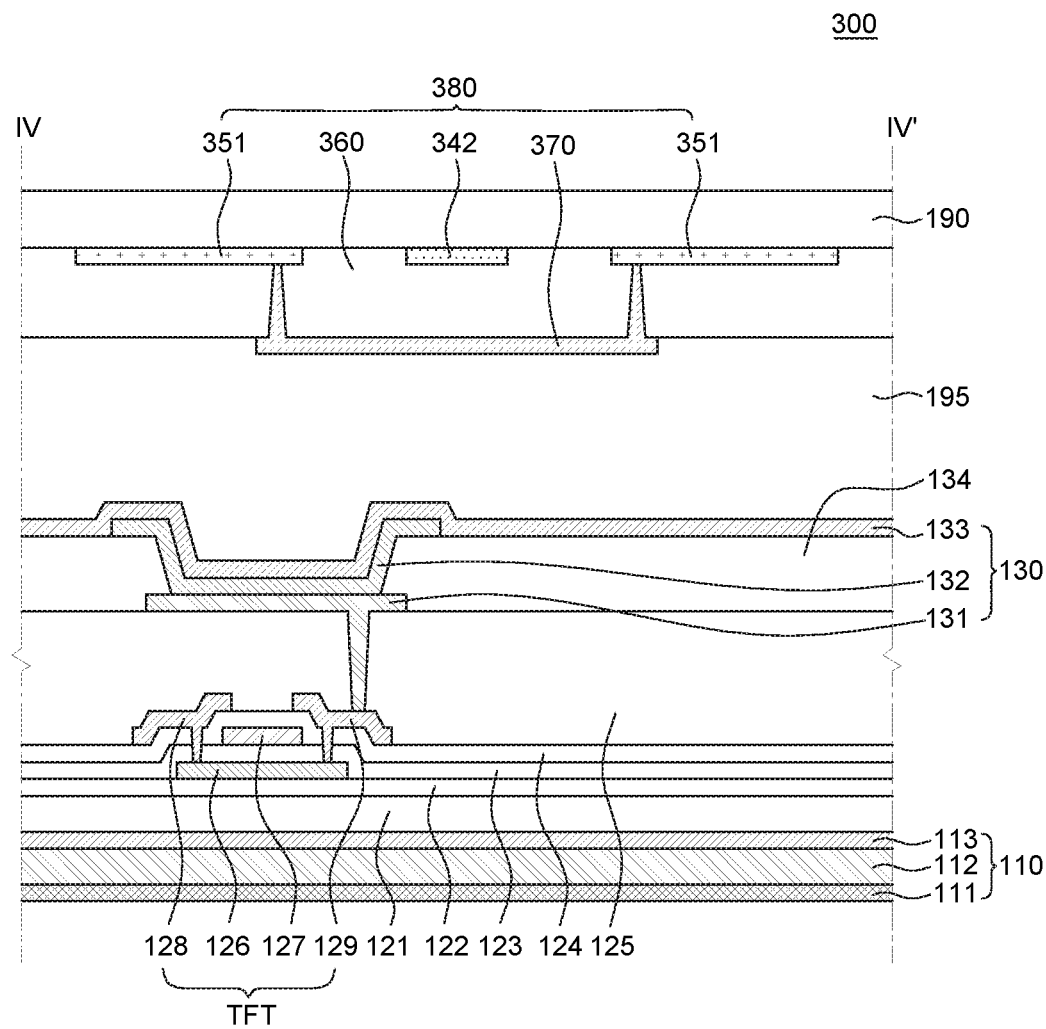
FIG. 4 is a schematic cross-sectional view taken along line IV-IV' of FIG. 3.

FIG. 3 is an exploded perspective view of an OLED device with an integrated pressure sensor according to another exemplary embodiment of the present disclosure. FIG. 4 is a schematic cross-sectional view taken along line IV-IV' of FIG. 3. The OLED device 300 shown in FIGS. 3 and 4 is substantially identical to the OLED device 100 shown in FIGS. 1 and 2 except for that a touch position sensing unit 380 is disposed under a cover substrate 190 as an in-cell type touch screen panel; and, therefore, the redundant description will be omitted.

Referring to FIG. 3, a first touch electrode 340 and a second touch electrode 350 are disposed under the cover substrate 190. The first touch blocks 341 of the first touch electrode 340 and the second touch blocks 351 of the second touch electrode 350 may be disposed so that they correspond to the respective sub pixels of the OLED device 300. According to some embodiments, the OLED device 300 may include a color filter, which may be disposed under the cover substrate 190. In this case, the first touch blocks 341 and the second touch blocks 351 may be disposed under the color filter so as to correspond to the respective filter regions in the color filter.

Referring to FIG. 4, an insulating layer 360 is disposed so that it covers the first touch blocks 341 and the second touch blocks 351. The insulating layer 360 includes contact holes via which a part of each of the second touch blocks 351 is exposed.

A second connection part 370 is disposed under the insulating layer 360. The second connection part 370 comes in contact with the second touch blocks 351 through the contact holes in the insulating layer 360 and electrically connects the second touch blocks 351 to one another.

The OLED device 300 according to this exemplary embodiment of the present disclosure may include a touch position sensing unit 380 inserted therein as an in-cell type display panel, instead of an add-on type touch screen panel. In this case, the thickness of the OLED device 300 can be further reduced, while the flexibility of the OLED device 300 can be further improved.

Figure 5:
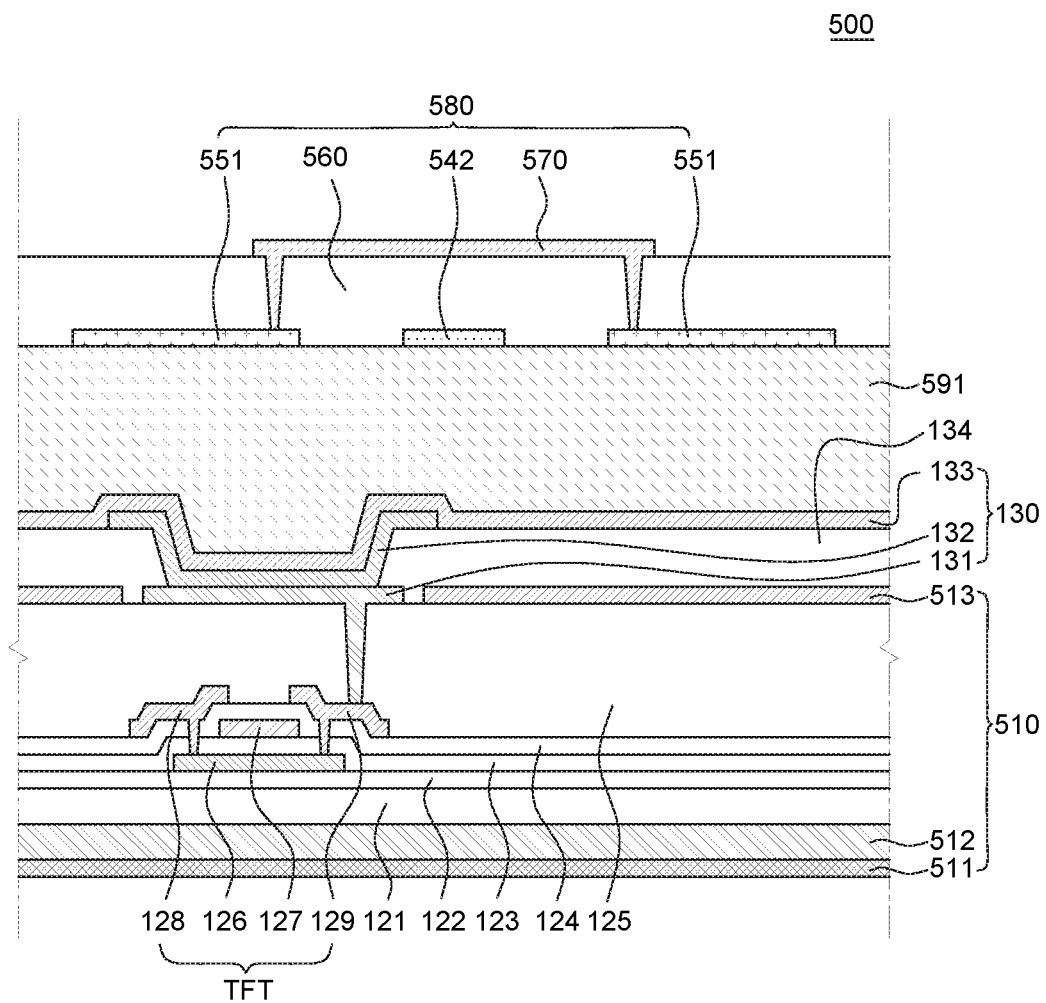
FIG. 5 is a cross-sectional view of an OLED device with an integrated pressure sensor according to yet another exemplary embodiment of the present disclosure.

FIG. 5 is a cross-sectional view of an OLED device with an integrated pressure sensor according to yet another exemplary embodiment of the present disclosure. The OLED device 500 shown in FIG. 5 is substantially identical to the OLED device 100 shown in FIGS. 1 and 2 except for that the former further includes an encapsulation layer 591 for encapsulating an organic light-emitting element 130 and that an upper electrode of a back-plate 510 is disposed on a substrate 121; and, therefore, the redundant description will be omitted.

Referring to FIG. 5, an encapsulation layer 591 is disposed to encapsulate the organic light-emitting element 130. The encapsulation layer 591 seals the organic light-emitting element 130 from the external environment. The encapsulation layer 591 is made of an insulative material. Although the encapsulation layer 591 of a single-layer structure is shown in FIG. 5, the encapsulation layer 591 may be made up of a multi-layer structure in which a number of insulating layers are stacked on one another. For example, a first encapsulation layer may be formed to cover the cathode 133 of the organic light-emitting element 130. The first encapsulation layer may be made of an inorganic insulative material such as silicon nitride ($SiN_x$) so as to suppress permeation of moisture and tightly seal the organic light-emitting element. A second encapsulation layer is formed on the first insulating layer so as to cover the first encapsulation layer. The second encapsulation layer may be made of organic insulative material or silicon oxycarbon (SiOC) to reduce level difference on the first encapsulation layer. A third encapsulation layer is formed to cover the second encapsulation layer. The third encapsulation layer may be made of an inorganic insulative material that suppresses permeation of moisture, such as silicon nitride or aluminum oxide ($Al_2O_3$).

The touch position sensing unit 580 is disposed on the encapsulation layer 591. For example, the first touch blocks and the second touch blocks 551 are disposed on the encapsulation layer 591, and the insulating layer 560 is disposed to cover the first touch blocks and the second touch blocks 551. The second connection part 570 electrically connects the second touch blocks 551 to each other through contact holes in the insulating layer 560.

According to some embodiments, a cover substrate may be further disposed on the touch position sensing unit 580. In this case, since the organic light-emitting element 130 is sealed by the encapsulation layer 591 and also by the cover substrate, it can be more reliably protected from the external environment.

An upper electrode 513 for sensing the intensity of a touch input is disposed above the substrate 121. For example, as shown in FIG. 5, the upper electrode 513 is disposed on the planarization layer 125. Since the anode 131 of the organic light-emitting element 130 is disposed on the planarization layer 125, the upper electrode 513 may be disposed in a region where the anode 131 is not disposed and between the sub pixels. However, this is merely illustrative. For example, the upper electrode 513 may be disposed on the same plane as the thin-film transistor TFT below the anode 131.

When the upper electrode 513 is disposed above the substrate 121, moisture or gas may permeate from below the substrate 121. Accordingly, a third glass may be further disposed between the substrate 121 and the elastic member 512 or in the elastic member 512. Since the thin glass suppresses permeation of moisture, it can work as a moisture-proof layer under the substrate 121.

Although the upper electrode 513 and the lower electrode 511 is spaced apart from each other in the OLED device 500 according to this embodiment of the present disclosure, the intensity of a touch input can be measured accurately. As described above, the substrate 121 may be implemented as a thin film having a thickness of 50 μm or less, and the thin-film transistor TFT formed on the substrate 121 may also have a very small thickness. Thin insulating layers such as the planarization layer 125, the interlayer insulating layer 124 and the gate insulating layer 123 are disposed between the upper electrode 513 and the lower electrode 511, and a capacitance is formed between the upper electrode 513 and the lower electrode 511 when a potential difference is made therebetween. Then, the intensity of a touch input can be measured based on the capacitance.

In addition, in the OLED device 500 according to this exemplary embodiment of the present disclosure, the organic light-emitting element 130 is sealed by the encapsulation layer 591, and the touch position sensing unit 580 is disposed on the encapsulation layer 591, the cover substrate for supporting the touch position sensing unit 580 can be omitted. As a result, there is an advantage in that the thickness of the OLED device 500 can be further reduced.

Figure 6:
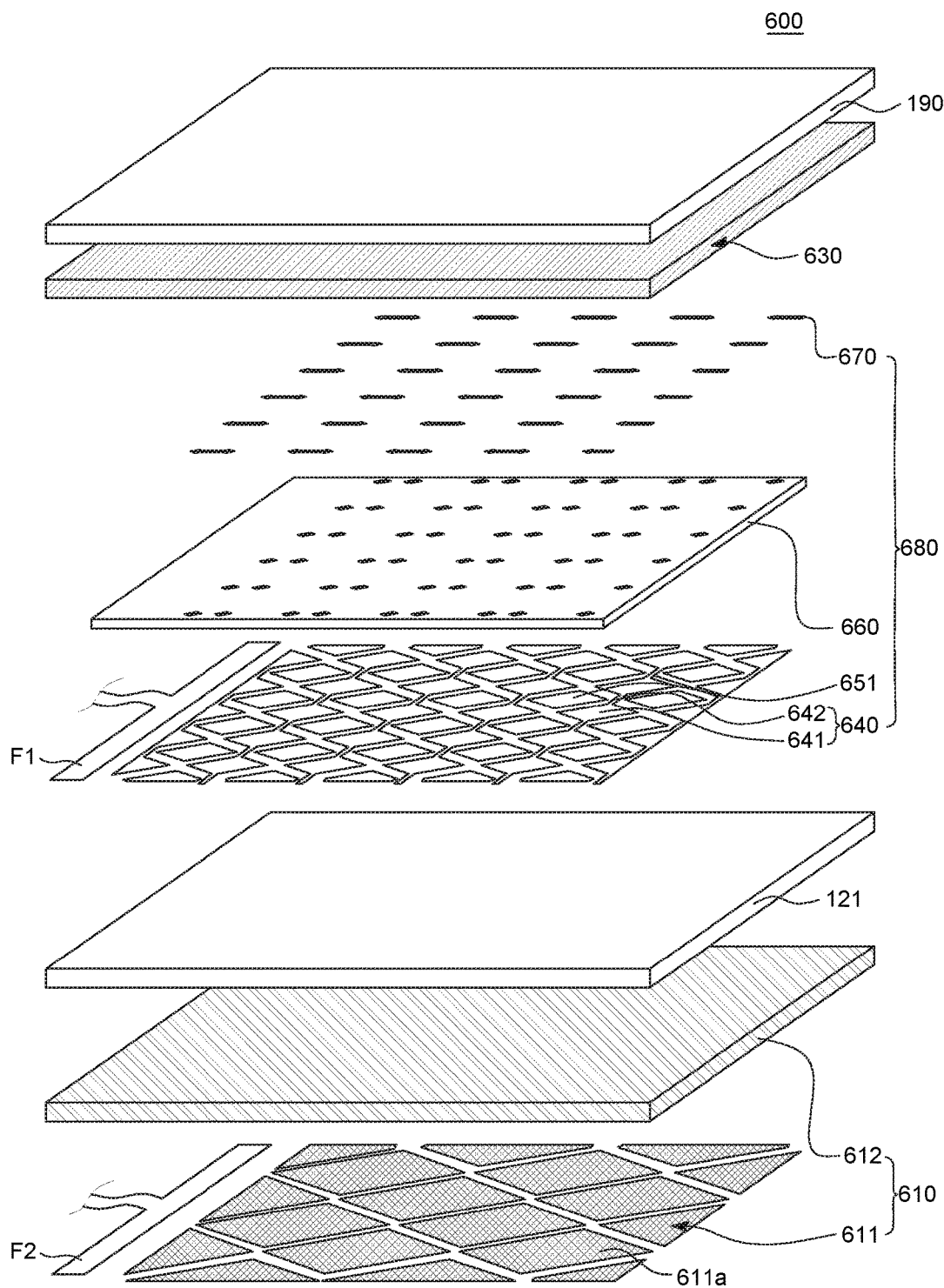
FIG. 6 is an exploded perspective view of an OLED device with an integrated touch screen according to an exemplary embodiment of the present disclosure.
Figure 7:
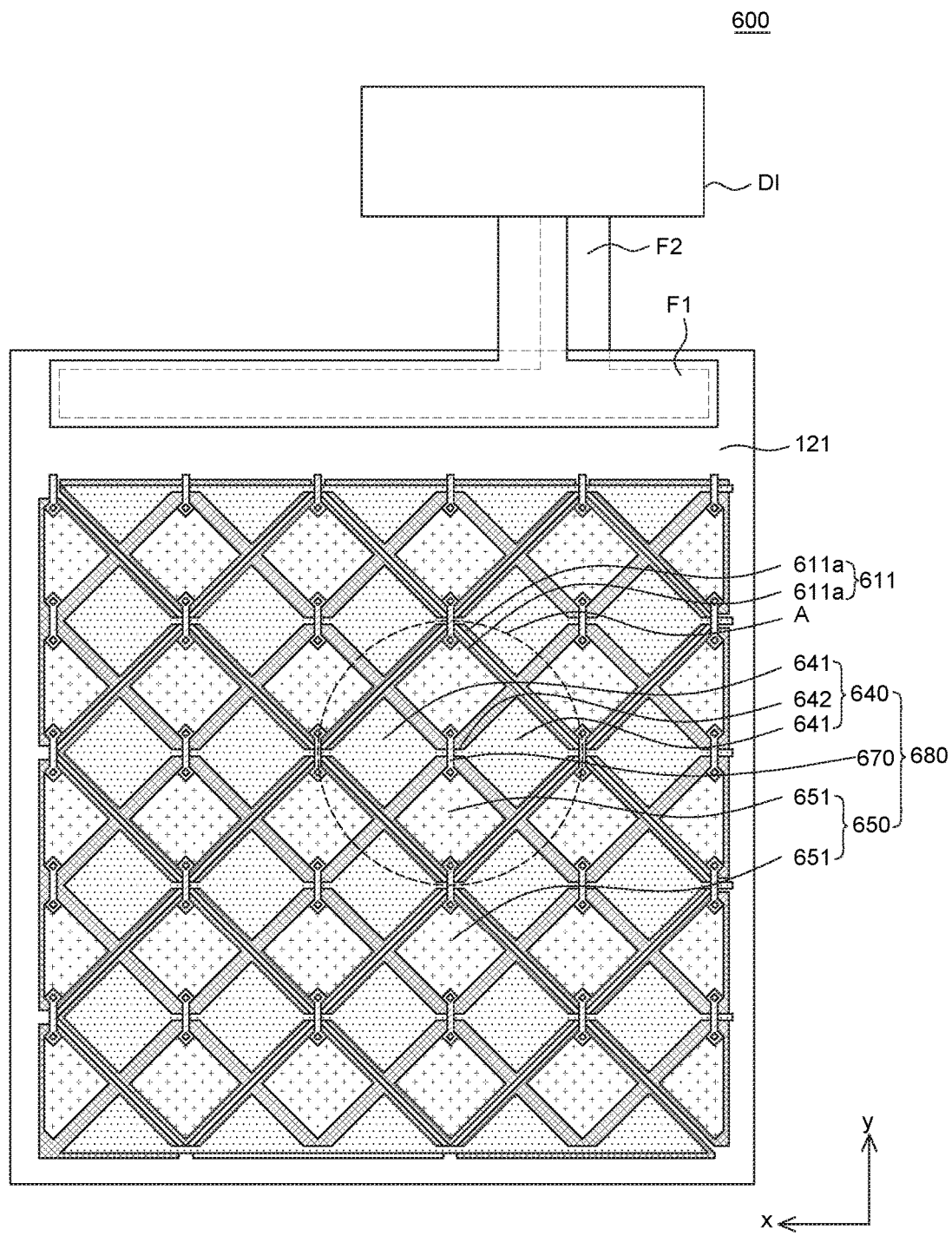
FIG. 7 is a plan view of an OLED device with an integrated touch screen according to an exemplary embodiment of the present disclosure.
Figure 8:
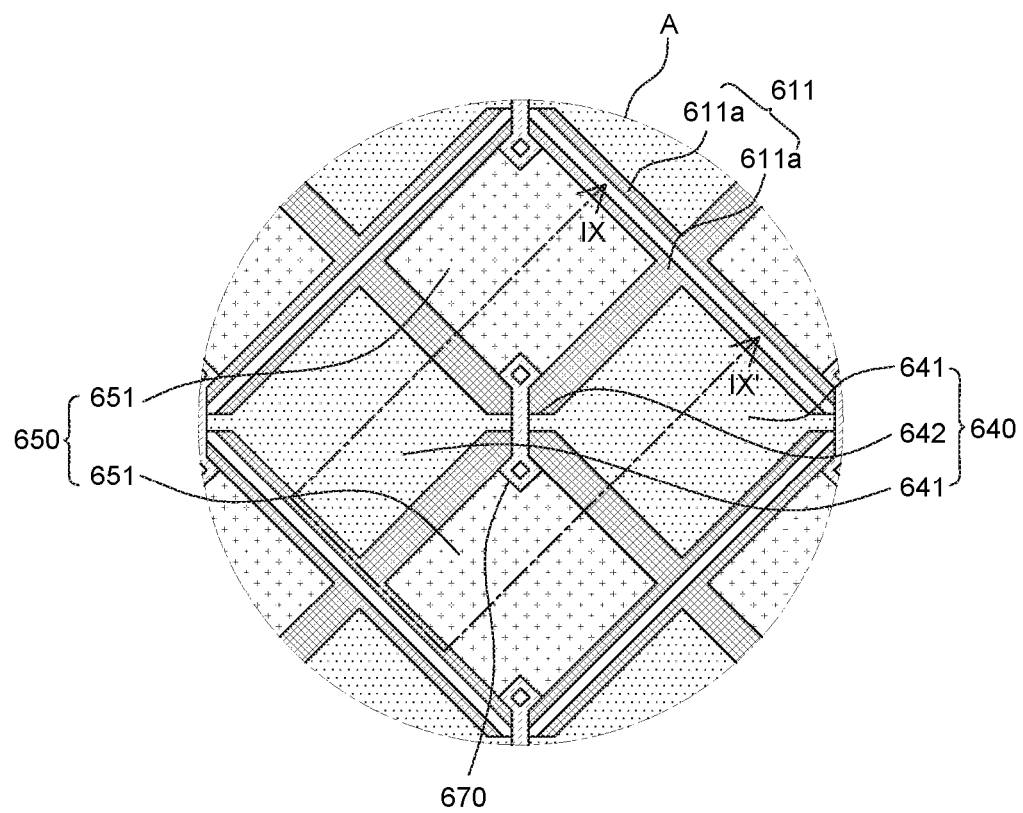
FIG. 8 is an enlarged plan view of area A shown in FIG. 7.
Figure 9:
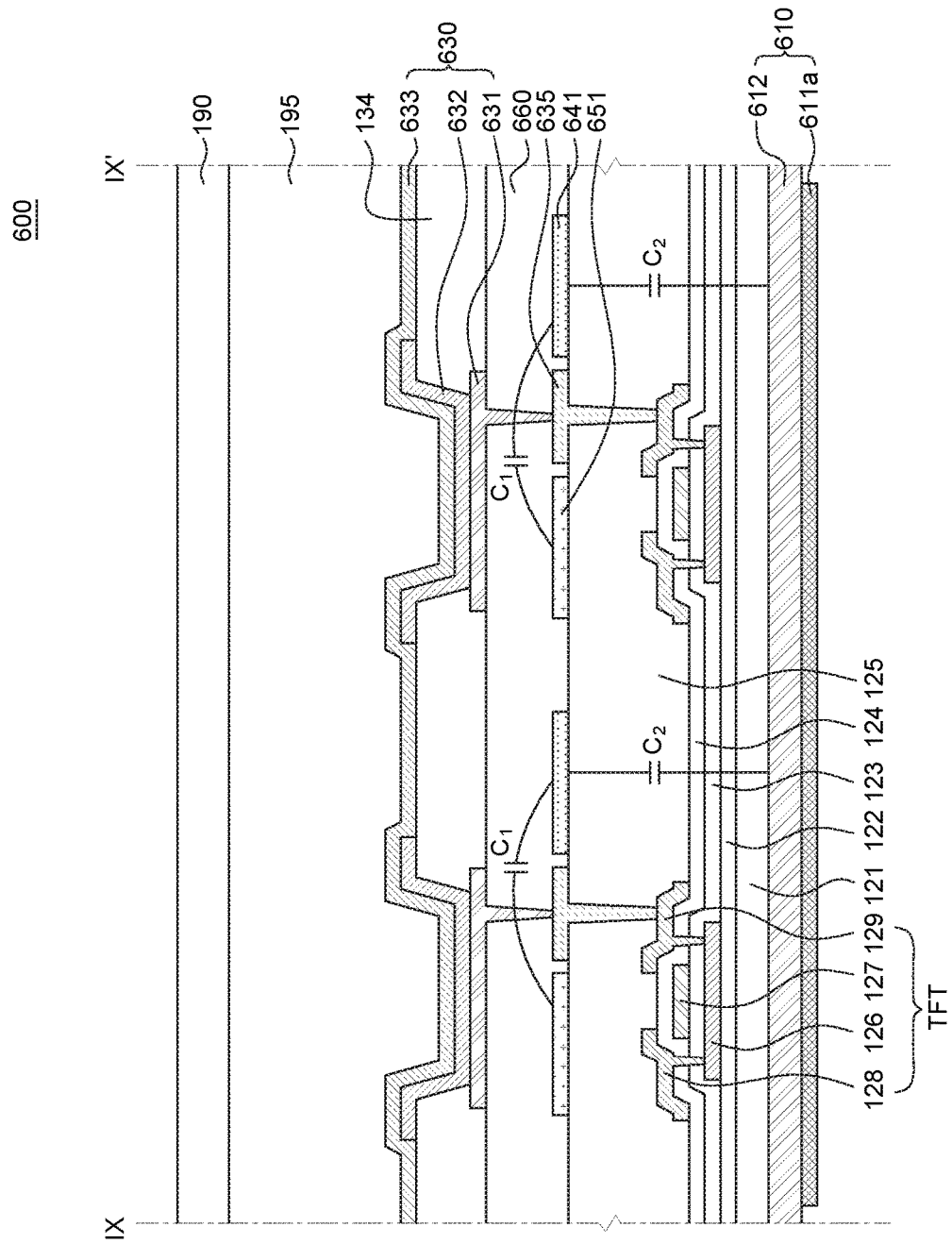
FIG. 9 is a cross-sectional view taken along line IX-IX' of FIG. 8.

FIG. 6 is an exploded perspective view of an OLED device with an integrated touch screen according to an exemplary embodiment of the present disclosure. FIG. 7 is a plan view of an OLED device with an integrated touch screen according to an exemplary embodiment of the present disclosure. FIG. 8 is an enlarged plan view of area A shown in FIG. 7. FIG. 9 is a cross-sectional view taken along line IX-IX' of FIG. 8. The OLED device 600 shown in FIGS. 6 to 9 is substantially identical to the OLED device 100 shown in FIGS. 1 and 2 except for that the upper electrode is eliminated, that a lower electrode 611 is patterned into a plurality of third touch blocks 611a, and that a touch position sensing unit 680 is disposed under an organic light-emitting element 630; and, therefore, the redundant description will be omitted. For convenience of illustration the organic light-emitting element 630, the cover substrate 190 and the elastic member 612 are not depicted and a first touch electrode 640, a second touch electrode 650, a third touch electrode 611 and the substrate 121 are schematically depicted in FIGS. 7 and 8.

Referring to FIG. 6, the substrate 121 is supported by the elastic member 612. The elastic member 612 has appropriate rigidity to prevent the warpage of the substrate 121. The elastic member 612 may have a thickness of 50 μm to 200 μm to reinforce the rigidity of the substrate 121.

A lower electrode 611 is disposed under the elastic member 612. The lower electrode 611 is patterned into the plurality of third touch blocks 611a. The third touch blocks 611a overlap with at least one of the plurality of first touch blocks 641 of the first touch electrode 640 or overlap with at least one of the plurality of second touch blocks 651 of the second touch electrode 650. The third touch blocks 611a form a capacitor with the first touch blocks 641 or the second touch blocks 651 and work as a pressure sensor for measuring the intensity of a touch input. Thus, the lower electrode 611 may be referred to as a third touch electrode. In the following description, the lower electrode 611 is referred to as a third touch electrode for convenience of illustration. Since the third touch electrode 611 is disposed under the substrate 121, the third touch electrode 611 does not decrease visibility and may be made of a low-resistance metal.

As shown in FIG. 6, a first flexible printed circuit board (FPCB) F1, which is electrically connected to the first touch electrode 640 and the second touch electrode 650, is disposed on the substrate 121, and a second flexible printed circuit board F2 electrically connected to the third touch electrode 611 is disposed below the substrate 121. The first flexible printed circuit board F1 transmits a touch driving signal to the first touch electrode 640 or the second touch electrode 650 and receives a touch sensing signal from the first touch electrode 640 or the second touch electrode 650. The second flexible printed circuit board F2 transmits a pressure driving signal to the third touch electrode 611 and receives a pressure sensing signal from the third touch electrode 611.

Referring to FIG. 7, the first flexible printed circuit board F1 and the second flexible printed circuit board F2 are connected to a touch controller DI. The touch controller DI is disposed on the system board of the OLED device 600. However, this is merely illustrative. The touch controller DI may be disposed on the first flexible printed circuit board F1 or the second flexible printed circuit board F2 in the form of a COF (Chip On Film) or may be disposed on the substrate 121 in the form of a COG (Chip on Glass).

The touch controller DI provides a touch driving signal to the first touch electrode 640 or the second touch electrode 650 and receives a touch sensing signal from the first touch electrode 640 or the second touch electrode 650. In addition, the touch controller DI provides a pressure driving signal to the third touch electrode 611 and receives a pressure sensing signal from the third touch electrode 611. The touch controller DI detects the position of a touch input by analyzing a change in the waveform of the touch driving signal and the waveform of the touch sensing signal, and detects the intensity of the touch input by analyzing in a change in the waveform of the pressure driving signal and the waveform of the pressure sensing signal. A detailed description thereof will be made below with reference to FIG. 9.

The third touch blocks 611a of the third touch electrode 611 overlap with at least one of the first touch blocks 641 or at least one of the second touch blocks 651. Specifically, as shown in FIG. 7, the first touch blocks 641 are arranged in a first direction (x-axis direction), while the second touch blocks 651 are arranged in a second direction (y-axis direction). As described above, a touch cell is defined at an intersection where the first touch electrode 640 intersects the second touch electrode 650. Two first touch blocks 641 and two second touch blocks 651 disposed around the intersection may be defined as a single touch cell. FIG. 8 is an enlarged plan view of a single touch cell.

Referring to FIG. 8, each of the third touch blocks 611a has the area equal to that of a touch cell. That is, each of the third touch blocks 611a overlaps with one touch cell. As mentioned earlier, since the area of the touch cell may be equal to an average area of a person's finger segment, the third touch blocks 611a may have the area equal to the average area of a person's finger segment. However, this is merely illustrative. For example, each of the third touch blocks 611a may have an area equal to the areas of plurality of touch cells.

Referring to FIG. 9, the first touch block 641 and the second touch block 651 are disposed on the planarization layer 125. The first touch block 641 and the second touch block 651 are disposed below the anode 631 of the organic light-emitting element 630. When the first touch block 641 and the second touch block 651 are disposed below the anode 631, they rarely degrade the visibility of the OLED device 600, and thus they may be made of a metal as well as a transparent conductive oxide.

The anode 631 of the organic light-emitting element 630 is electrically connected to the thin-film transistor TFT by an intermediate electrode 635. For example, an insulating layer 660 is disposed under the anode 631, and the first touch block 641 and the second touch block 651 are disposed between the insulating layer 660 and the planarization layer 125. The anode 631 is connected to the intermediate electrode 635 via a contact hole in the insulating layer 660, and the intermediate electrode 635 is connected to the thin-film transistor TFT via a contact hole in the planarization layer 125.

In the OLED device 600 according to according to an exemplary embodiment of the present disclosure, the upper electrode of the back-plate 610 is eliminated, and instead the first touch electrode 640 or the second touch electrode 640 of the touch position sensing unit 680 works as an upper electrode for measuring the intensity of a touch input.

Specifically, as shown in FIG. 9, a first capacitance $C_1$ is formed between the first touch block 641 of the first touch electrode 640 and the second touch block 651 of the second touch electrode 650, and a second capacitance $C_2$ is formed between the first touch block 641 and the third touch block 611a. For example, a touch driving signal may be applied to the first touch block 641, and the second touch block 651 may be connected to the ground potential. However, this is merely illustrative. For example, the first touch block 641 may be connected to the ground potential and a touch driving signal may be applied to the second touch block 651, or different touch driving signals may be applied to the first touch block 641 and the second touch block 651, respectively. The touch driving signal may be a voltage signal in the form of pulses. When a touch driving signal is applied, a potential difference is created between the first touch block 641 to which the voltage is applied and the second touch block 651 connected to the ground potential. As a result, a first capacitance $C_1$ is generated between the touch block 641 and the second touch block 651.

When a user's touch input is made, the electric field between the first touch blocks 641 and the second touch blocks 651 can be changed by the finger, and the first capacitance $C_1$ between the first touch block 641 and the second touch block 651 is changed. The touch controller DI senses a change in the voltage between the first touch blocks 641 and the second touch blocks 651 and detects coordinates of the point where the first capacitance $C_1$ is changed.

A pressure driving signal is applied to the third touch blocks 611a overlapping with the first touch blocks 641. The pressure driving signal may be a voltage signal having the same phase as the touch driving signal applied to the first touch block 641. That is, the voltage is applied to the first touch blocks 641 and the third touch blocks 611a at the same timing, and the voltage is released at the same timing. However, this is merely illustrative. For example, the pressure driving signal may be a voltage signal having a phase opposite to that of the touch driving signal, or may be a combination of a signal having the same phase as the touch driving signal and a signal having the opposite phase to the touch driving signal. A detailed description thereof will be given below with reference to FIGS. 10A to 10D. Hereinafter, area example will be described, in which a pressure driving signal having the same phase as the touch driving signal is applied to the third touch block 611a. When a pressure driving signal applied to the third touch blocks 611a and the touch driving signal are in-phase, the voltage is applied to the third touch block 611a and the first touch block 641 at the same timing, and thus cross talk can be suppressed, by which the voltage value of the first touch block 641 fluctuates by the pressure driving signal applied to the third touch block 611a. If a voltage is first applied to the first touch block 641 and then is applied to the third touch block 611a, the voltage of the first touch block 641 is coupled with the voltage of the third touch block 611a, such that it is changed. Accordingly, if a pressure driving signal in the form of pulses is applied to the third touch block 611a, the voltage value of the first touch blocks 641 is coupled with the pressure driving signal and fluctuates. In contrast, if voltage is applied to the first touch block 641 and the third touch block 611a at the same timing, the voltage changes at the same timing in the first touch block 641 and in the third touch block 611a, such that the coupling effect can be suppressed. As a result, crosstalk between the first touch block 641 and the third touch block 611a can be reduced. In this case, since the voltage value of the first touch block 641 can be kept constant, the first capacitance $C_1$ between the first touch block 641 and the second touch block 651 is kept constant, such that touch sensitivity of the touch position sensing unit 680 can be further improved.

On the other hand, when a weak touch input is made, the distance between the first touch block 641 and the third touch block 611a is changed due to the user's touch input, and accordingly the second capacitance between the first touch block 641 and the third touch block 611a is changed. The touch controller DI measures the intensity of a touch input by measuring the second capacitance $C_2$ between the first touch blocks 641 and the third touch blocks 611a. When a weak touch input is made, a change in the distance between the first touch block 641 and the third touch block 611a is small, and thus the measured second capacitance $C_2$ is small.

When a strong touch input is made, the distance between the first touch block 641 and the third touch block 611a is reduced as compared with the weak touch input. Accordingly, the second capacitance $C_2$ between the first touch block 641 and the third touch block 611a is increased as compared with the weak touch input. The touch controller DI measures the intensity of the touch input by measuring the second capacitance $C_2$.

According to some embodiments, the first touch electrode 640 and the second touch electrode 650 may be disposed above the organic light-emitting element 630. By doing so, the distance between the cover substrate 190 on which the touch input is made and the first touch electrode 640 and the second touch electrode 650 becomes small, such that a touch input can be sensed more precisely. In addition, the anode 631 and the cathode 633 are disposed between the first touch blocks 641 of the first touch electrode 640 and the third touch blocks 611a of the third touch electrode 611, such that the second capacitance $C_2$ between the first touch blocks 641 and the third touch blocks 611a may be affected by the signals of the anode 631 and the cathode 633. In order to avoid this, the touch controller DI may apply a pressure driving signal to the third touch block 611a during a blank period in which the organic light-emitting element 630 does not emit light. By doing so, the OLED device 600 may be configured to display images during a display period and detect a touch input during a blank period.

In the OLED device 600 according to the exemplary embodiment of the present disclosure, an electrode of the touch position sensing unit 680 for sensing the position of a touch input is used as an electrode for measuring the intensity of the touch input. That is, as shown in FIG. 9, the first touch electrode 640 of the touch position sensing unit 680 is used as an electrode for sensing the two-dimensional position of the touch input together with the second touch electrode 650, and is also used as an electrode for measuring the intensity of the touch input together with the third touch electrode 611. Accordingly, the OLED device 600 does not require any additional pressure sensor for sensing a three-dimensional touch input, and can sense both of the position and intensity of a touch input with three electrodes in the in-cell type touch screen panel.

In addition, in the OLED device 600, the elastic member 612 disposed on the third touch electrode 611 works as a dielectric material for measuring the intensity of a touch input and also as a support substrate for supporting the substrate 121. Therefore, no additional support substrate for preventing warpage or tear is required, and the thickness of the OLED device 600 can be further reduced.

Incidentally, the OLED device 600 according to the exemplary embodiment of the present disclosure may operate in a particular driving manner to accurately detect a touch input and to reduce erroneous operation. Detailed description thereon will be given below with reference to FIGS. 10A to 10D.

FIGS. 10A to 10D are diagrams showing waveforms of driving signals applied to a touch position sensing unit and a pressure sensor of an OLED device with an integrated touch screen according to an exemplary embodiment of the present disclosure.

Figure 10A:
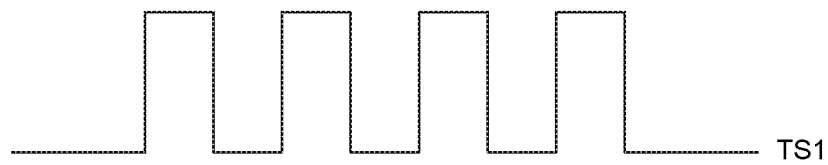
FIGS. 10A to 10D are diagrams showing waveforms of driving signals applied to a touch position sensing unit and a pressure sensor of an OLED device with an integrated touch screen according to an exemplary embodiment of the present disclosure.
Figure 10A:
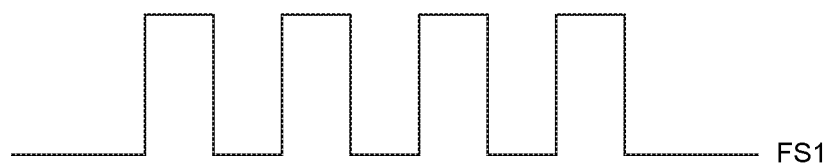

Referring to FIG. 10A, the touch controller DI applies a first touch driving signal TS1 to the first touch electrode 640 or the second touch electrode 650 and applies a first pressure driving signal FS1 to the third touch electrode 611 at the same timing, which is in-phase with the touch driving signal TS1. As the voltage signals are applied to the respective touch electrodes at the same timing, the voltages of the touch electrodes can be stably maintained. For example, if a first voltage is applied to the first touch blocks 641 and then a second voltage is applied to the third touch blocks 611a at different timings, the voltage value of the first touch blocks 641 is coupled with the second voltage applied to the third touch blocks 611a such that it fluctuates. That is, since the time point at which the voltage of the first touch block 641 is abruptly changed is different from the time point at which the voltage of the third touch block 611a is abruptly changed, the voltage of the first touch block 641 is coupled with the voltage of the third touch block 611a such that it fluctuates. On the other hand, if the first touch driving signal TS1 is in-phase with the first pressure driving signal FS1, the time point at which the voltage of the first touch blocks 641 is abruptly changed is identical to the time point at which the voltage of the third touch blocks 611a is abruptly changed, the fluctuation of the voltage of the first touch block 641 is reduced, and thus the voltage of the first touch block 641 can be kept constant. Thus, a change in the first capacitance $C_1$ between the first touch block 641 and the second touch block 651 can be sensed precisely, and the interference between the first touch driving signal TS1 and the first pressure driving signal FS1 can be suppressed.

Figure 10B:
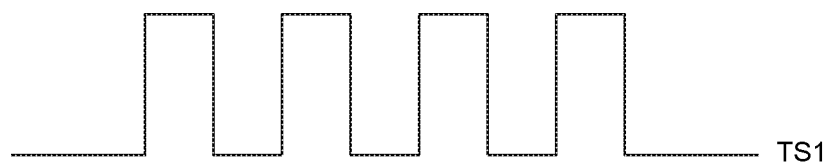
Figure 10B:
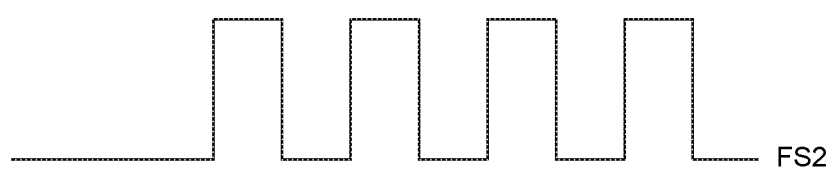

Referring to FIG. 10B, the touch controller DI applies a first touch driving signal TS1 to the first touch electrode 640 or the second touch electrode 650 and applies a first pressure driving signal FS1 to the third touch electrode 611, which is in anti-phase with the touch driving signal TS1. Although voltages are applied to the first touch blocks 641 and the third touch blocks 611a at different timings, respectively, the time points at which the voltages of the first touch blocks 641 and the third touch blocks 611a are abruptly changed are still same. Accordingly, the coupling effect between the voltage of the first touch block 641 and the voltage of the third touch block 611a is suppressed, and a change in the voltage of the first touch blocks 641 can be reduced. As a result, the interference between the first touch driving signal TS1 and the second pressure driving signal FS2 can be reduced, and the touch input can be sensed more accurately.

Figure 10C:
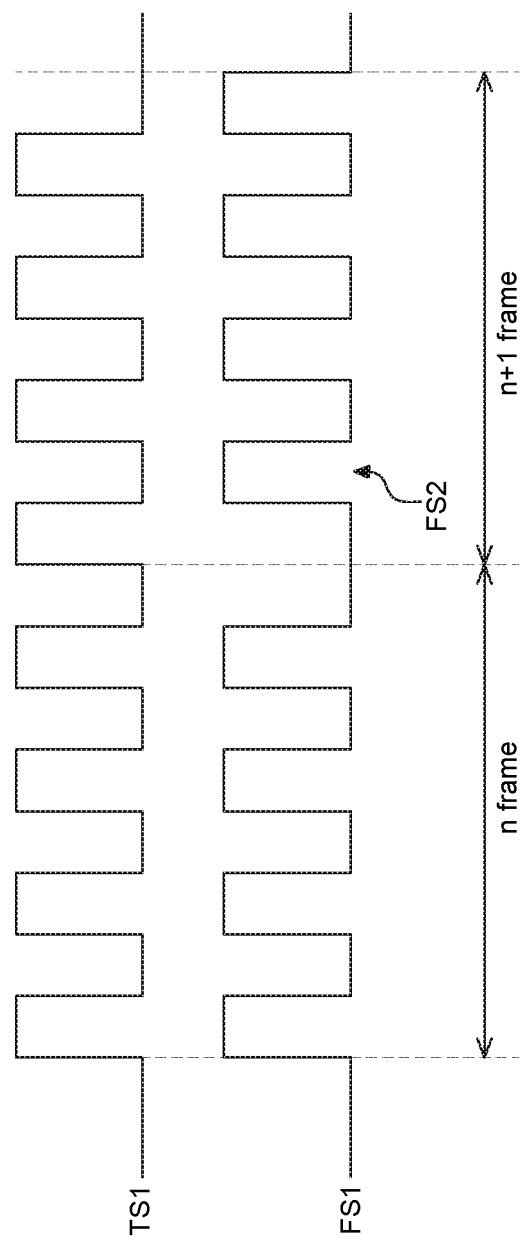

Referring to FIG. 10C, the touch controller DI, in the $n^{th}$ frame, where n is an integer, applies a first touch driving signal TS1 to the first touch electrode 640 or the second touch electrode 650 and applies a first pressure driving signal FS1 to the third touch electrode 611, which is in-phase with the touch driving signal TS1. Subsequently, in the $(n+1)^{th}$ frame, the touch controller DI applies the first touch driving signal TS1 to the first touch electrode 640 or the second touch electrode 650 and applies a second pressure driving signal FS2 to the third touch electrode 611, which is in anti-phase with the touch driving signal TS1. In this case, the time points at which the voltages of the first touch blocks 641 and the third touch blocks 611a are abruptly changed are still same. Accordingly, the coupling effect between the voltage of the first touch blocks 641 and the voltage of the third touch blocks 611a is suppressed, and a change in the voltage of the first touch blocks 641 can be reduced.

Incidentally, if the phase of the pressure driving signal is inverted every frame, the intensity of the touch input can be measured more precisely. Specifically, the phase of the touch driving signal applied to the first touch blocks 641 is the same throughout all of the frames, whereas the phase of the pressure driving signal applied to the third touch blocks 651 is inverted every frame. Accordingly, the phase of the touch sensing signal sensed by the second touch blocks 651 is the same in all the frames, but the phase of the pressure sensing signal sensed by the third touch blocks 611a is inverted every frame. That is, the pressure sensing signal is inverted every frame so that it has a positive value and a negative value alternately. The touch sensing signal value at the $n^{th}$ frame minus the touch sensing signal value at the $(n+1)^{th}$ frame approximates zero. On the other hand, the pressure sensing signal value at the $n^{th}$ minus the pressure sensing signal value at the $(n+1)^{th}$ frame equals twice the value of the pressure sensing signal value. Accordingly, the component of the touch sensing signal can be removed from the sensing signal, and thus the touch sensing signal can be distinguished from the pressure sensing signal. Thus, the strength of the touch input can be precisely measured based on the pressure sensing signal value.

Figure 10D:
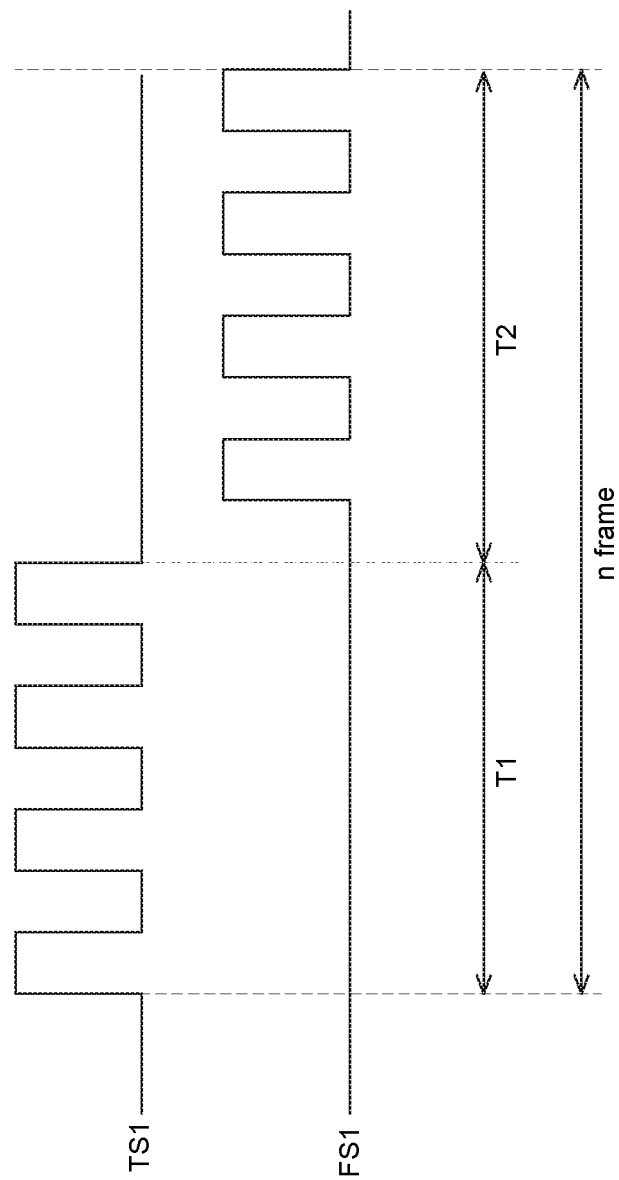

Referring to FIG. 10D, the touch controller DI, in the $n^{th}$ frame, applies only the first touch driving signal TS1 to the first touch electrode 640 or the second touch electrode 650 during a touch sensing period T1 and applies the first pressure driving signal FS1 to the third touch electrode 611 during a pressure sensing period T2. That is, the position of the touch input and the intensity of the touch input can be sensed separately, and the OLED device 600 can be time-divisionally driven.

That is, the position of a touch input is detected by the first touch electrode 640 and the second touch electrode 650 during the touch sensing period T1, while the intensity of the touch input is measured by the third touch electrode 611 and the first touch electrode 640 or by the third touch electrode 611 and the second touch electrode 650 during the pressure sensing period of time T2. By doing so, the position of the touch input and the intensity of the touch input are detected at different times, and thus the touch input can be measured more precisely. As a result, the touch sensitivity of the OLED device 600 can be improved.

Although the touch sensing period T1 and the pressure sensing period T2 are shown as having the same length in FIG. 10D, according to some embodiments, the touch sensing period T1 may be longer than the pressure sensing period T2. The position of a touch input can be detected by sequentially sensing the first touch blocks 641 and the second touch blocks 651 arranged in a matrix. Since the high-resolution touch position sensing unit 680 includes a large number of touch blocks, it may take a long time to sense the position of the touch input. Accordingly, the touch sensing period T1 may be set longer than the pressure sensing period T2 for sensing the intensity of a touch input, and time-division driving can be efficiently performed.

Consequently, in the OLED device 600 according to the exemplary embodiment of the present disclosure, the first touch electrode 610 is used as an electrode for sensing the position of a touch input and also as an electrode for measuring the intensity of the touch input. Accordingly, the upper electrode of the pressure sensor for measuring the intensity of a touch input can be eliminated, and thus the thickness of the OLED device 600 can be reduced. In this case, to precisely measure the position and intensity of a touch input, driving signals in phase or anti-phase may be applied to the first touch electrode 640 and the third touch electrode 611, respectively. In addition, a pressure driving signal whose phase is inverted every frame may be applied to the third touch electrode 611. By doing so, since the phase of the pressure sensing signal is inverted every frame, the pressure sensing signal can be distinguished from the touch sensing signal, and the intensity of the touch input can be measured more precisely. In addition, by applying the touch driving signal and the pressure driving signal time-divisionally, the position of a touch input and the intensity of the touch input can be sensed at different times, and thus the accuracy of the touch sensing can be further improved.

The exemplary embodiments of the present disclosure can also be described as follows:

According to an embodiment of the present disclosure, The OLED device includes a substrate, an organic light-emitting element, and a back-plate. The substrate has a thin-film transistor and has flexibility. The organic light-emitting element is connected to the thin-film transistor on the substrate. The back-plate supports the substrate under the substrate and has a pressure sensor configured to measure the intensity of a touch input.

The back-plate may include an elastic member; a lower electrode under the elastic member; and an upper electrode on the elastic member.

The upper electrode may come in contact with a lower surface of the substrate, and the upper electrode and the lower electrode may be made of a metal.

The upper electrode may be on the substrate, the upper electrode may be made of a transparent conductive oxide (TCO), and the lower electrode may be made of a metal.

The OLED device may further include: a touch position sensing unit on the organic light-emitting element and configured to sense a position of a user's touch input in response to the touch input.

The OLED device may further include an encapsulation layer covering the organic light-emitting element. The touch position sensing unit may be on the encapsulation layer.

The OLED device may further include: a cover substrate facing the substrate and covering the organic light-emitting element. The touch position sensing unit may be above or below the cover substrate.

According to another embodiment of the present disclosure, there is provided an OLED device with an integrated touch screen including a substrate, an organic light-emitting element, a first touch electrode, a second touch electrode, an elastic member, and a third touch electrode. The substrate has a thin-film transistor and has flexibility. The organic light-emitting element is connected to the thin-film transistor on the substrate. The first touch electrode and the second touch electrode are on the substrate. The elastic member supports the substrate. The third touch electrode is under the elastic member and overlaps with the first touch electrode or the second touch electrode.

The first touch electrode may include a plurality of first touch blocks arranged in a first direction and electrically connected to one another. The second touch electrode may include a plurality of second touch blocks arranged in a second direction and electrically connected to one another. The third touch electrode may include at least one third touch block overlapping with at least one of the first touch blocks or at least one of the second touch blocks.

The OLED device may further include: an insulating layer covering the plurality of first touch blocks and the plurality of second touch blocks. The plurality of first touch blocks and the plurality of second touch blocks may be on a same plane, the first touch blocks may be electrically connected to one another by a first connection part in the same plane, and the second touch blocks may be electrically connected to one another by a second connection part on the insulating layer.

The first touch electrode and the second touch electrode may be made of a transparent conductive oxide (TCO), and the third touch electrode may be made of a metal.

The OLED device may further include: a touch controller configured to provide a touch driving signal to the first touch electrode or the second touch electrode and to apply a pressure driving signal to the third touch electrode.

The touch controller may provide the touch driving signal and the pressure driving signal in phase at a same timing.

The touch controller may provide the touch driving signal and the pressure driving signal in anti-phase at a same timing.

The touch controller may provide a first pressure driving signal in phase with the touch driving signal at a same timing in an $n^{th}$ frame, and provide a second pressure drive signal in anti-phase with the touch driving signal at a same timing in an $(n+1)^{th}$ frame.

The touch controller may provide the touch driving signal during a touch sensing period and provide the pressure driving signal during a pressure sensing period.

The touch sensing period may be longer than the pressure sensing period.

The organic light-emitting element may include: an anode connected to the thin-film transistor; an organic layer on the anode; and a cathode on the organic layer. The first touch electrode and the second touch electrode may be below the anode.

It will be apparent to those skilled in the art that various modifications and variations can be made in the OLED device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting display (OLED) device with an integrated touch screen, the device comprising:
   a substrate comprising a thin-film transistor and having flexibility;
   an organic light-emitting element on a front surface of the substrate and connected to the thin-film transistor;
   first and second touch electrodes between the organic light-emitting element and the substrate;
   an elastic member on a rear surface of the substrate to support the substrate; and
   a third touch electrode under the elastic member and overlapping with the first touch electrode or the second touch electrode.

2. The OLED device of claim 1, wherein:
   the first touch electrode comprises a plurality of first touch blocks arranged in a first direction and electrically connected to one another;
   the second touch electrode comprises a plurality of second touch blocks arranged in a second direction and electrically connected to one another, the second direction intersecting the first direction; and
   the third touch electrode comprises at least one third touch block overlapping at least one of the first touch blocks or at least one of the second touch blocks.

3. The OLED device of claim 2, further comprising:
   an insulating layer covering the plurality of first touch blocks and the plurality of second touch blocks,
   wherein the plurality of first touch blocks and the plurality of second touch blocks are on a same plane,
   wherein the first touch blocks are electrically connected to one another by a first connection part in the same plane, and
   wherein the second touch blocks are electrically connected to one another by a second connection part on the insulating layer.

4. The OLED device of claim 2, wherein:
   the first touch electrode and the second touch electrode are made of a transparent conductive oxide (TCO); and
   the third touch electrode is made of a metal.

5. The OLED device of claim 2, further comprising a touch controller configured to:
   provide a touch driving signal to the first touch electrode or the second touch electrode; and
   apply a pressure driving signal to the third touch electrode.

6. The OLED device of claim 5, wherein the touch controller is further configured to provide the touch driving signal and the pressure driving signal in phase at a same timing.

7. The OLED device of claim 5, wherein the touch controller is further configured to provide the touch driving signal and the pressure driving signal in anti-phase at a same timing.

8. The OLED device of claim 5, wherein the touch controller is further configured to:
   provide a first pressure driving signal in phase with the touch driving signal at a same timing in an $n^{th}$ frame; and
   provide a second pressure drive signal in anti-phase with the touch driving signal at a same timing in $(n+1)^{th}$ frame.

9. The OLED device of claim 5, wherein the touch controller is further configured to:
   provide the touch driving signal during a touch sensing period; and
   provide the pressure driving signal during a pressure sensing period.

10. The OLED device of claim 9, wherein the touch sensing period is longer than the pressure sensing period.

11. The OLED device of claim 1, wherein the organic light-emitting element comprises:
    an anode connected to the thin-film transistor;
    an organic layer on the anode; and
    a cathode on the organic layer,
    wherein the first touch electrode and the second touch electrode are under the anode.

12. The OLED device of claim 1, wherein the third touch electrode is configured to:
    form a capacitance with the first touch electrode or the second touch electrode; and
    work as a pressure sensor for measuring an amount of touch input pressure.

13. The OLED device of claim 12, wherein:
    a first capacitance is formed between the first touch electrode and the second touch electrode; and
    a second capacitance is formed between the first touch electrode and the third touch electrode.

* * * * *